US 12,451,879 B2

(12) United States Patent
Heo et al.

(10) Patent No.: US 12,451,879 B2
(45) Date of Patent: Oct. 21, 2025

(54) SEMICONDUCTOR DEVICE

(71) Applicant: SAMSUNG ELECTRONICS CO., LTD., Suwon-si (KR)

(72) Inventors: Jin Heo, Suwon-si (KR); Jongkyu Song, Suwon-si (KR); Minho Kim, Suwon-si (KR); Jooyoung Song, Suwon-si (KR); Chanhee Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 150 days.

(21) Appl. No.: 18/236,303

(22) Filed: Aug. 21, 2023

(65) Prior Publication Data
US 2024/0259008 A1 Aug. 1, 2024

(30) Foreign Application Priority Data
Jan. 31, 2023 (KR) .................. 10-2023-0012429

(51) Int. Cl.
*H03K 17/08* (2006.01)
(52) U.S. Cl.
CPC .................. *H03K 17/08* (2013.01)
(58) Field of Classification Search
CPC ............ H03K 17/08; H03K 19/00315; H10D 89/811; H10D 89/819; H10D 89/711; H10D 89/921; H10D 89/611; H10D 89/713; H10D 89/911; H02M 1/32
USPC .......................................... 361/56
See application file for complete search history.

(56) References Cited

U.S. PATENT DOCUMENTS

| | | | |
|---|---|---|---|
| 6,919,602 B2 * | 7/2005 | Lin | H10D 89/811 361/111 |
| 7,477,497 B2 | 1/2009 | Botula et al. | |
| 8,441,765 B2 | 5/2013 | Barbier et al. | |
| 9,545,041 B2 | 1/2017 | Lai et al. | |
| 11,380,671 B2 * | 7/2022 | Ma | H10D 89/811 |
| 11,444,445 B2 * | 9/2022 | Dua | H02H 9/046 |
| 11,456,595 B2 | 9/2022 | Kim | |

(Continued)

FOREIGN PATENT DOCUMENTS

| | | | | |
|---|---|---|---|---|
| CN | 104409456 A | * | 3/2015 | |
| CN | 116682820 A | * | 9/2023 | ........... H10D 89/611 |

(Continued)

OTHER PUBLICATIONS

Communication issued on Apr. 4, 2024 by the European Patent Office for European Patent Application No. 23205440.3.

*Primary Examiner* — Dharti H Patel
(74) *Attorney, Agent, or Firm* — Sughrue Mion, PLLC

(57) ABSTRACT

A semiconductor device is provided. The semiconductor device includes: a first power pad; a second power pad; a signal pad; a clamping circuit connected between the first power pad and the second power pad; a driving circuit connected to the signal pad and including a pull-up circuit and a pull-down circuit; and a first gate-off circuit connected to the pull-down circuit. The first gate-off circuit is configured to connect a gate of the pull-down circuit and a source of the pull-down circuit to each other during an electrostatic discharge (ESD) event in which a high voltage is applied to the signal pad, and control a current generated by the high voltage to flow to the clamping circuit.

20 Claims, 10 Drawing Sheets

(56) References Cited

U.S. PATENT DOCUMENTS

| | | | |
|---|---|---|---|
| 11,626,719 B2* | 4/2023 | Yeh | H02H 1/0007 |
| | | | 361/100 |
| 11,848,554 B2* | 12/2023 | Hsu | H10D 89/711 |
| 12,148,746 B2* | 11/2024 | Hsu | H10D 89/921 |
| 2005/0078419 A1* | 4/2005 | Stockinger | H10D 89/921 |
| | | | 361/56 |
| 2007/0047162 A1* | 3/2007 | Watanabe | H10D 89/811 |
| | | | 361/56 |
| 2008/0094767 A1 | 4/2008 | Watanabe | |
| 2010/0103572 A1* | 4/2010 | Worley | H03F 1/523 |
| | | | 361/56 |
| 2010/0165524 A1* | 7/2010 | Lim | H10D 89/601 |
| | | | 361/56 |
| 2010/0265622 A1 | 10/2010 | Campi, Jr. et al. | |
| 2011/0026176 A1* | 2/2011 | Kim | H10D 89/811 |
| | | | 361/56 |
| 2011/0058293 A1 | 3/2011 | Pardoen et al. | |
| 2012/0075757 A1 | 3/2012 | Chen | |
| 2014/0035091 A1* | 2/2014 | Smith | H10D 89/611 |
| | | | 257/499 |
| 2015/0380397 A1* | 12/2015 | Dabral | H10D 89/611 |
| | | | 361/56 |
| 2020/0243512 A1* | 7/2020 | Sharma | H10D 89/811 |
| 2022/0239095 A1 | 7/2022 | Lee et al. | |

FOREIGN PATENT DOCUMENTS

| | | |
|---|---|---|
| JP | 2008-227003 A | 9/2008 |
| JP | 2017-009340 A | 1/2017 |

\* cited by examiner

SEMICONDUCTOR DEVICE

CROSS-REFERENCE TO RELATED APPLICATION(S)

This application claims priority to Korean Patent Application No. 10-2023-0012429, filed on Jan. 31, 2023, in the Korean Intellectual Property Office, the disclosure of which is incorporated by reference herein in its entirety.

BACKGROUND

The present disclosure relates to a semiconductor device.

A semiconductor device includes a plurality of semiconductor elements, and some of the semiconductor elements may include a receiver circuit and a transmitter circuit for transmitting and receiving signals with other external semiconductor devices. The receiver circuit and the transmitter circuit may be connected to a pad through which signals are transmitted and received. In order to protect the semiconductor elements from an electrostatic discharge (ESD) that may be introduced from an external source through the pad, the receiver circuit and the transmitter circuit may be connected to an ESD protection circuit. However, the ESD is not the only potential source of damaging current. In this regard, although the ESD protection circuit is provided, there may be a problem in that the semiconductor element may be damaged by a current introduced into the semiconductor element from a source other than the ESD.

SUMMARY

One or more example embodiments provide a semiconductor device including a gate-off circuit, connected to a gate of a semiconductor element connected to a pad and configured to direct a current introduced into the pad due to an electrostatic discharge (ESD) to an ESD protection circuit and away from the semiconductor element.

According to an aspect of an example embodiment, a semiconductor device includes: a first power pad; a second power pad; a signal pad; a clamping circuit connected between the first power pad and the second power pad; a driving circuit connected to the signal pad and including a pull-up circuit and a pull-down circuit; and a first gate-off circuit connected to the pull-down circuit. The first gate-off circuit is configured to connect a gate of the pull-down circuit and a source of the pull-down circuit to each other during an ESD event in which a high voltage is applied to the signal pad, and control a current generated by the high voltage to flow to the clamping circuit.

According to an aspect of an example embodiment, a semiconductor device includes: a first power pad configured to receive a first power voltage; a second power pad configured to receive a second power voltage having a level lower than a level of the first power voltage; a driving circuit connected to a signal pad, and including a pull-up circuit and a pull-down circuit; and a gate-off circuit including a switch circuit connected between a source and a gate of the pull-down circuit and the pull-up circuit, a first transistor connected between one of the first power pad and the second power pad and a gate of the switch circuit, and a second transistor connected between the gate of the switch circuit and the signal pad.

According to an aspect of an example embodiment, a semiconductor device includes: an ESD protection circuit connected to a pad and configured to provide a path through which an ESD current flows; a logic circuit connected to the pad; and a gate-off circuit connected to a target circuit of the logic circuit, and including a switch circuit configured to be turned on by the ESD current flowing from the pad in a state in which the pad is floated and configured to connect a gate of the target circuit and a source of the target circuit to each other.

Advantages and effects of the present disclosure are not limited to those discussed above.

BRIEF DESCRIPTION OF DRAWINGS

The above and other aspects, features, and advantages of the present disclosure will be more clearly understood from the following description of example embodiments, taken in conjunction with the accompanying drawings, in which.

DETAILED DESCRIPTION

Figure 1:
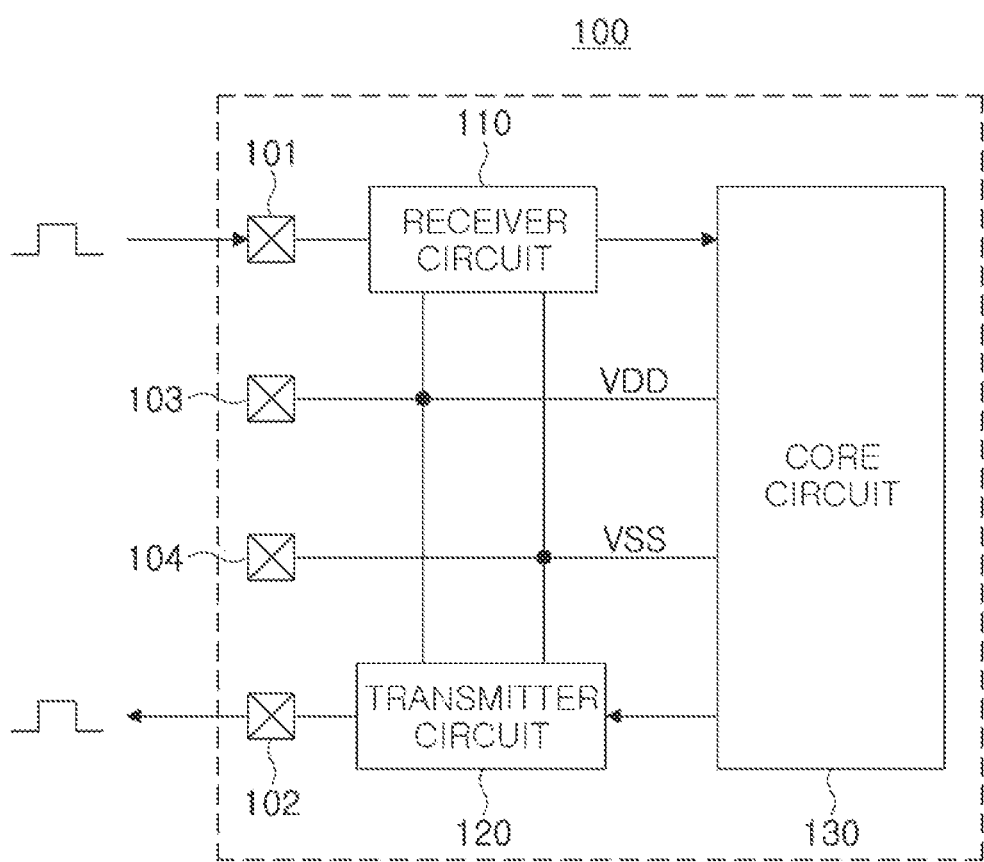
FIG. 1 is a block diagram schematically illustrating a semiconductor device according to an example embodiment.

Hereinafter, example embodiments will be described with reference to the accompanying drawings. The same reference numerals may refer to the same elements throughout. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present.

FIG. 1 is a block diagram schematically illustrating a semiconductor device according to an example embodiment.

Referring to FIG. 1, a semiconductor device 100 according to an example embodiment may include signal pads 101 and 102, power pads 103 and 104, a receiver circuit 110, a transmitter circuit 120, and a core circuit 130. The semiconductor device 100 may transmit or receive a signal to or from other external semiconductor devices through the signal pads 101 and 102. For example, the signal pad 101 may be an input pad and the receiver circuit 110 may receive an external input signal through the signal pad 101. For example, the signal pad 102 may be an output pad and the transmitter circuit 120 may transmit an external output signal through the signal pad 102.

Each of the receiver circuit 110, the transmitter circuit 120, and the core circuit 130 may include a plurality of semiconductor elements. The receiver circuit 110 may include a receiver, and the transmitter circuit 120 may include a driving circuit. The core circuit 130 may include various circuits configured so the semiconductor device 100 may provide a predetermined function, such as a central processing unit (CPU), a graphic processing unit (GPU), an image signal processor (ISP), a neural processing unit (NPU), a modem, and a cache memory.

The receiver circuit 110 may process an external input signal input to the signal pad 101 and transmit the processed external input signal to the core circuit 130. The transmitter circuit 120 may process the signal received from the core circuit 130 to generate an external output signal and transmit the external output signal through the signal pad 102. In an example embodiment, each of the external input signal and the external output signal may be a signal having a predetermined frequency as illustrated in FIG. 1.

A power voltage VDD and a reference voltage VSS used for operations of each of the receiver circuit 110, the transmitter circuit 120, and the core circuit 130 may be input to the power pads 103 and 104. For example, the power voltage VDD may be input to the first power pad 103, and the reference voltage VSS may be input to the second power supply pad 104. The reference voltage VSS may be lower than the power voltage VDD.

In a state in which the pads 101 to 104 of the semiconductor device 100 are not connected to other semiconductor devices, a high voltage due to the ESD and the like may be applied to at least a portion of the pads 101 to 104. For example, under an ESD event condition in which the high voltage is applied to at least one of the signal pads 101 and 102 due to the ESD, a very large current may flow in a semiconductor element included in the receiver circuit 110 and the transmitter circuit 120, which may damage the semiconductor element. In an example embodiment, an ESD event may occur in a situation in which a body is in close proximity to at least one of floated pads 101 to 104.

In this manner, in order to prevent damage to the semiconductor element that may occur under the ESD event condition, an ESD protection circuit for providing a movement path of a current may be included in the receiver circuit 110 and the transmitter circuit 120. In an example embodiment, the ESD protection circuit may include an input/output protection circuit including diodes connected to one of the signal pads 101 and 102, and a clamping circuit.

The ESD protection circuit may provide a path through which a current introduced into the semiconductor device 100 flows under the ESD event condition. Ideally, the current generated by the ESD around the semiconductor device 100 and introduced into the signal pads 101 and 102 may flow to the clamping circuit through at least one of the diodes of the input/output protection circuit.

However, even when the ESD protection circuit is provided, the current generated by the ESD may not flow to the clamping circuit. For example, in the ESD event condition, the current generated by the ESD may flow through at least one of the semiconductor elements connected to the signal pad 102 inside the transmitter circuit 120. Accordingly, even when the ESD protection circuit is provided, damage to the semiconductor elements due to the ESD may occur under the ESD event condition.

In an example embodiment, a gate-off circuit may be connected to one of the signal pads 101 and 102, and a semiconductor element included in the receiver circuit 110 and/or the transmitter circuit 120. The gate-off circuit may prevent a current path from being formed through the semiconductor element connected to one of the signal pads 101 and 102 under the ESD event conditions. Accordingly, in the ESD event condition, the current introduced into the signal pads 101 and 102 may flow to the clamping circuit and effectively prevent the damage to the semiconductor elements included in the receiver circuit 110 and/or the transmitter circuit 120.

Figure 2A:
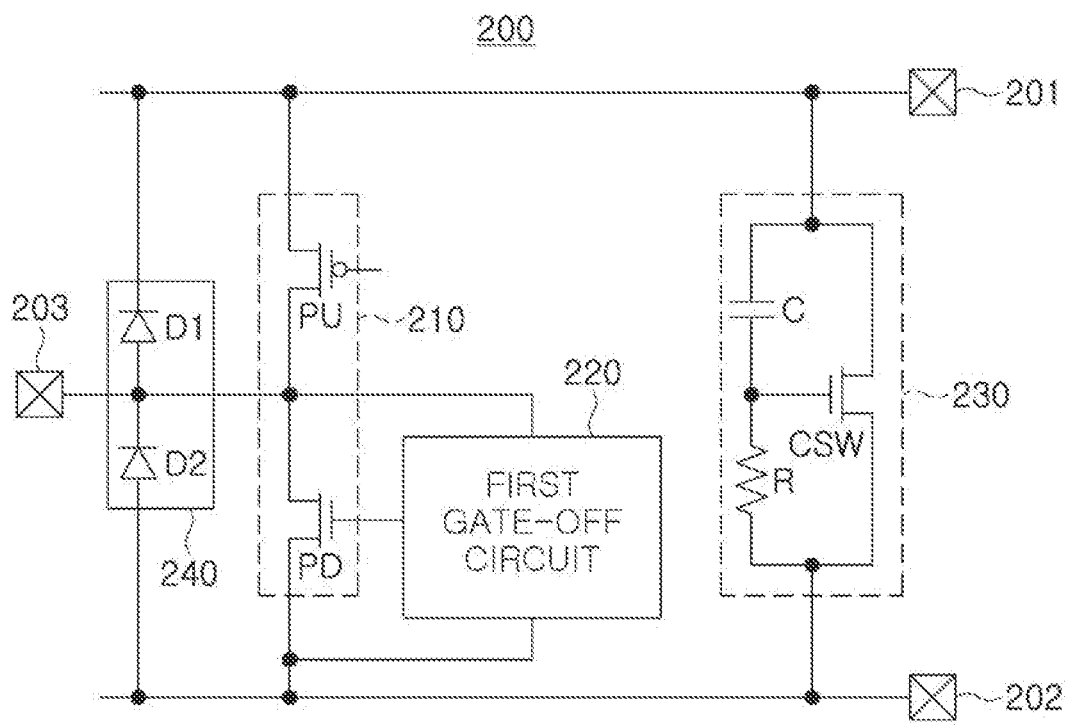
FIGS. 2A and 2B are diagrams schematically illustrating a semiconductor device according to an example embodiment.
Figure 2B:
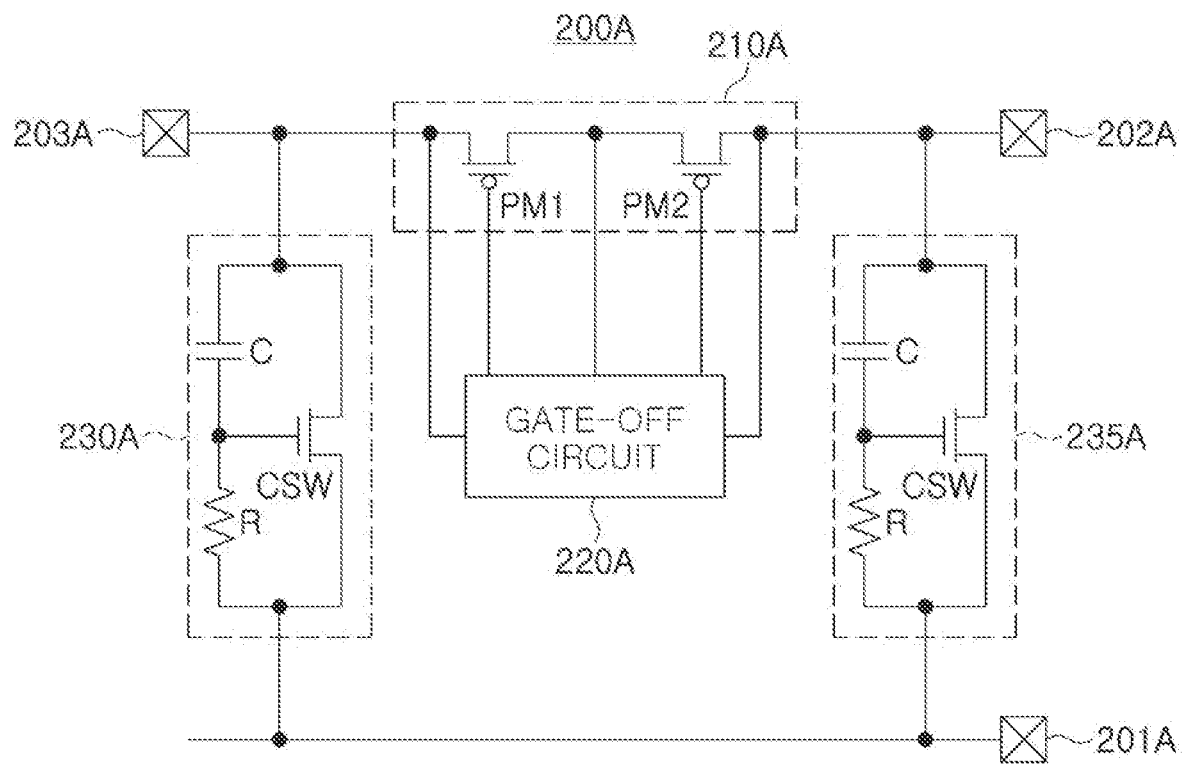

FIGS. 2A and 2B are diagrams schematically illustrating a semiconductor device according to an example embodiment.

First, referring to FIG. 2A, a semiconductor device 200 according to an example embodiment may include a first power pad 201, a second power pad 202, a signal pad 203, a logic circuit 210, a first gate-off circuit 220, a clamping circuit 230, and an input/output protection circuit 240. For example, the first power pad 201 may be a pad through which a power voltage is input, and the second power pad 202 may be a pad through which a reference voltage on a level lower than that of the power voltage is input.

The logic circuit 210 may be connected to the signal pad 203 and may be a driving circuit including a pull-up element PU and a pull-down element PD. In an example embodiment, the pull-up element PU may be a p-channel metal oxide semiconductor (PMOS) transistor and the pull-down element PD may be an n-channel metal oxide semiconductor (NMOS) transistor. A source of the pull-up element PU may receive a power voltage input to the first power pad 201, and a source of the pull-down element PD may receive a reference voltage input to the second power pad 202. Each drain of the pull-up element PU and the pull-down element PD may be connected to the signal pad 203 and may provide an output node of the logic circuit 210.

For example, each gate of the pull-up element PU and the pull-down element PD may be connected to a core circuit of the semiconductor device 200, and a logic circuit 210 may output a signal to the signal pad 203 according to a control signal input to each gate of the pull-up element PU and the pull-down element PD. As another example, as illustrated in FIG. 2A, the gate of the pull-down element PD may be connected to the first gate-off circuit 220.

The first gate-off circuit 220 may be connected to the signal pad 203, which is an output node of the logic circuit 210. Furthermore, the first gate-off circuit 220 may be connected to the gate of the pull-down element PD. For example, when the high voltage due to the ESD is applied to the signal pad 203 under the ESD event condition, at least one of the elements included in the first gate-off circuit 220 may be turned on, and a gate and a source of the pull-down element PD, which is a target element among the elements included in the logic circuit 210, may be connected to each other.

As the gate and the source of the pull-down element PD as the target element are connected to each other, the pull-down element PD is off and a current path through a channel of the pull-down element PD may not be formed. Accordingly, the current generated by the high voltage applied to the signal pad 203 may flow to the clamping circuit 230 rather than the logic circuit 210, thus preventing damage to the pull-up element PU and the pull-down element PD.

The clamping circuit 230 may be connected between the first power pad 201 and the second power pad 202 and may include a capacitor element C, a resistance element R, and a clamp switch element CSW. A gate of the clamp switch element CSW may be connected to a node between the capacitor element C and the resistor element R. The clamping circuit 230 may be connected to the signal pad 203 through a first diode D1 and a second diode D2 of the input/output protection circuit 240.

Next, referring to FIG. 2B, a semiconductor device 200A may include a first power pad 201A, a second power pad 202A, a signal pad 203A, a logic circuit 210A, a first gate-off circuit 220A, a first clamping circuit 230A, and a second clamping circuit 235A. As illustrated in FIG. 2A, the first power pad 201A may be a pad for receiving a power voltage, and the second power pad 202A may be a pad for receiving a reference voltage on a level lower than that of the power voltage.

As illustrated in FIG. 2B, the logic circuit 210A may be connected between the signal pad 203A and the second power pad 202A, and may include a first PMOS element PM1 and a second PMOS element PM2. A source, a drain, and a gate of each of the first PMOS element PM1 and the second PMOS element PM2 may be connected to the gate-off circuit 220A.

When the high voltage is applied to the signal pad 203A due to the ESD, the gate-off circuit 220A may prevent a current from flowing to the elements PM1 and PM2 included in the logic circuit 210A. For example, the current generated by the high voltage applied to the signal pad 203A may flow to the second power pad 202A through the first clamping circuit 230A and the second clamping circuit 235A by the gate-off circuit 220A. The structure of each of the first clamping circuit 230A and the second clamping circuit 235A may be similar to the clamping circuit 230 described with reference to FIG. 2A. For example, when the high voltage due to the ESD is applied to the signal pad 203A under the ESD event condition, at least one of the elements included in the gate-off circuit 220A may be turned on, and a gate and a source of the element PM1 may be connected to each other, and/or a gate and a source of the element PM2 may be connected to each other. As the gate and the source of the element PM1 and/or the gate and the source of the element PM2 are connected to each other, the element PM1 and/or the element PM2 is off and a current path through a channel of the elements PM1 and PM2 may not be formed.

Figure 3:
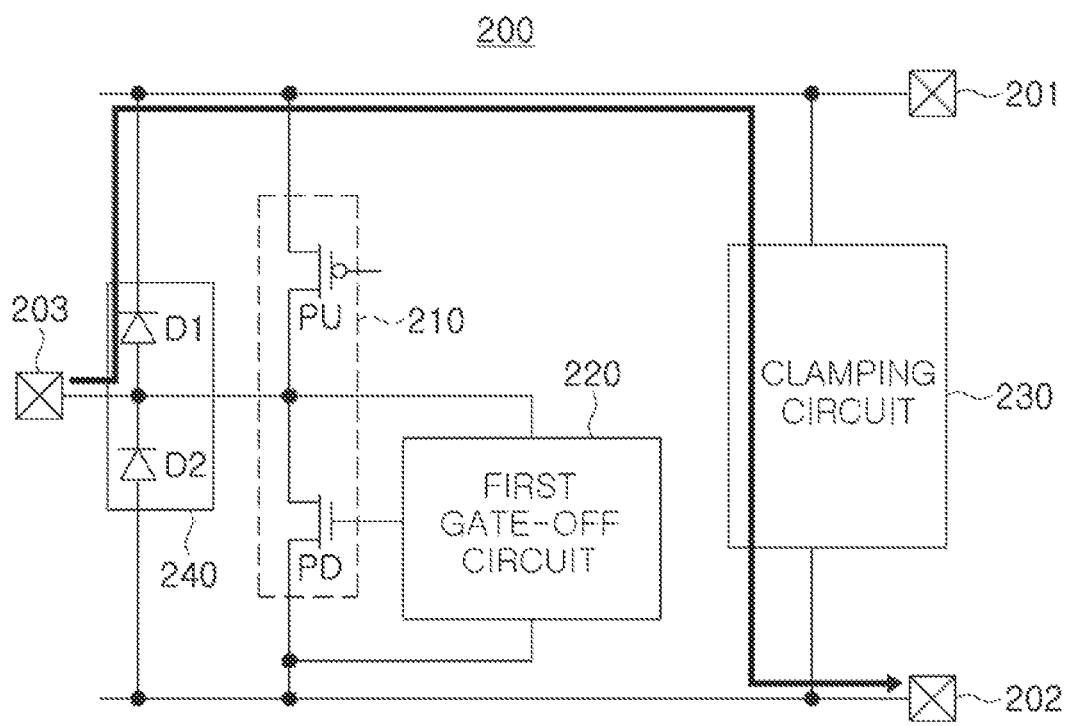
FIGS. 3 and 4 are diagrams provided to illustrate operations of a semiconductor device according to an example embodiment.
Figure 4:
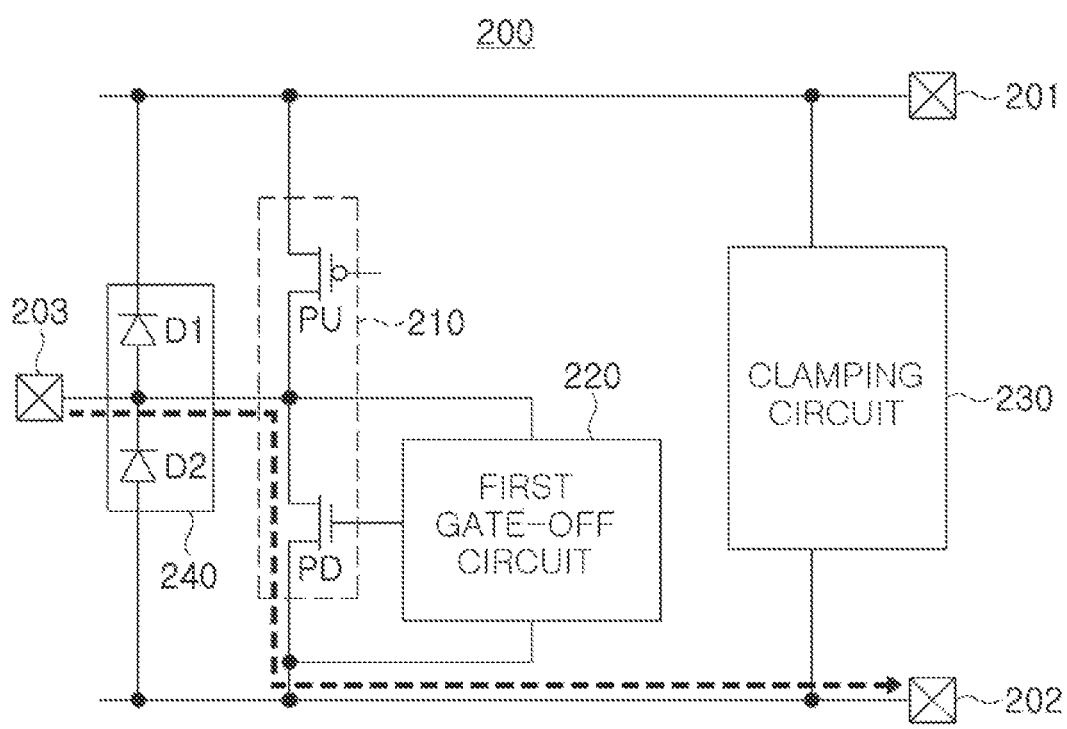

FIGS. 3 and 4 are diagrams provided to illustrate operations of a semiconductor device according to an example embodiment.

In an example embodiment described with reference to FIGS. 3 and 4, a semiconductor device 200 may have a structure similar to that described with reference to FIG. 2A. The semiconductor device 200 may include a first power pad 201, a second power pad 202, a signal pad 203, a logic circuit 210, a first gate-off circuit 220, a clamping circuit 230, and an input/output protection circuit 240. As described above, a power voltage may be input to the first power pad 201, and a reference voltage on a level lower than that of the power voltage may be input to the second power pad 202. The logic circuit 210 may be a driving circuit for outputting a predetermined signal to the signal pad 203.

In an example embodiment, in the ESD event condition in which the high voltage is applied to the signal pad 203 due to the ESD or the like, the current due to the high voltage applied to the signal pad 203 may flow into the semiconductor device 200. In an ideal case, the current due to the high voltage applied to the signal pad 203, as illustrated in FIG. 3, may flow to the second power pad 202 through the first diode D1 and the clamping circuit 230.

However, in some cases, instead of the current due to the high voltage applied to the signal pad 203 flowing to a path including the first diode D1 and the clamping circuit 230, the current may flow to a path including the pull-up element PU and/or the pull-down element PD of the logic circuit 210. For example, the pull-up element PU and the pull-down element PD included in the logic circuit 210 may be formed in a relatively large area as compared to other devices in order to output a swing signal at a predetermined level. Accordingly, when the high voltage generated by the ESD and a resulting current are applied to the signal pad 203, a parasitic capacitance present between a drain and a gate of the pull-down element PD may be charged to turn on the pull-down element PD. In this case, as illustrated in FIG. 4, a path through which a current flows from the signal pad 203 to the second power pad 202 may be formed through the pull-down element PD, and accordingly, the pull-down element PD may be damaged.

In an example embodiment, the first gate-off circuit 220 may be connected to the pull-down element PD. An ESD event in which the high voltage is applied to the signal pad 203 due to the ESD or the like may occur in a state in which the first power pad 201 and the second power pad 202 as well as the signal pad 203 are floated. In an example embodiment, the first gate-off circuit 220 may connect the gate and the source of the pull-down element PD under the ESD event condition to strongly turn off the pull-down element PD, thereby preventing the formation of a path of a current passing through the pull-down element PD.

The first gate-off circuit 220 includes a plurality of transistors, and at least one of the plurality of transistors is connected between the gate and the source of the pull-down element PD as a switch element, and the remaining transistors may provide a voltage dividing circuit. For example, the voltage dividing circuit may be directly connected to the signal pad 203. When the high voltage is applied to the signal pad 203 under the ESD event condition, the voltage dividing circuit may turn on the switch element by the current introduced from the signal pad 203, and the gate and the source of the pull-down element PD may be connected to each other by the turned-on switch element. Accordingly, the first gate-off circuit may interfere to prevent the pull-down element PD from being turned on, and as illustrated in FIG. 4, because a path of the current passing through the pull-down element PD is not formed, the logic circuit 210 may be effectively protected.

In this regard, when the high voltage is applied to the signal pad 203 by an external ESD in a state in which the pads 201 to 203 are floated and a resulting current is introduced, the first gate-off circuit 220 may strongly turn off the pull-down element PD to interfere with the formation of a current path as illustrated in FIG. 4. In a general operation condition in which a power voltage is input to the first power pad 201, a reference voltage is input to the second power pad 202, and the signal pad 203 is connected to other external semiconductor devices, the first gate-off circuit 220 may receive a power voltage. This will be described below.

Figure 5:
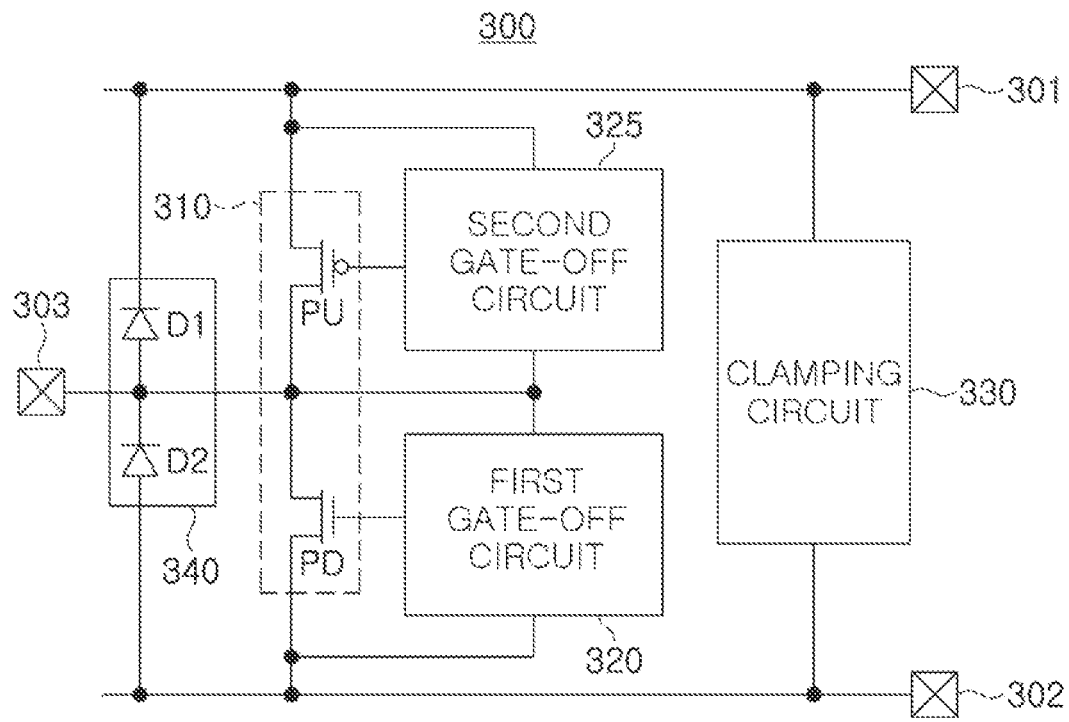
FIG. 5 is a diagram schematically illustrating a semiconductor device according to an example embodiment.

FIG. 5 is a diagram schematically illustrating a semiconductor device according to an example embodiment.

Referring to FIG. 5, the semiconductor device 300 may include a first power pad 301, a second power pad 302, a signal pad 303, a logic circuit 310, a first gate-off circuit 320, a second gate-off circuit 325, a clamping circuit 330, and an input/output protection circuit 340. As illustrated in FIG. 5, the first gate-off circuit 320 may be connected to the pull-down element PD included in the logic circuit 310, and the second gate-off circuit 325 may be connected to the pull-up element PU.

The second gate-off circuit 325 may include a switch element connected between the gate and the source of the pull-up element PU. A switch element of the second gate-off circuit 325 may be turned on under an ESD event condition in which the high voltage is applied to the signal pad 303 by the external ESD or the like, thus preventing a current introduced into the signal pad 303 from flowing into the pull-up element PU. Similarly to the previously description with reference to FIGS. 3 and 4, the gate and the source of the pull-up element PU may be connected to each other by the second gate-off circuit 325 to strongly turn off the pull-up element PU. Accordingly, the current introduced into the signal pad 303 may flow to the second power pad 302 through the clamping circuit 330 without passing through the pull-up element PU.

The second gate-off circuit 325 may include a circuit having a structure similar to that of the first gate-off circuit 320. For example, the second gate-off circuit 325 may include a switch element connected between the gate and the source of the pull-up element PU, and a voltage dividing circuit directly connected to the signal pad 303. When the high voltage is applied to the signal pad 303, the voltage dividing circuit may turn on the switch element to connect the gate and the source of the pull-up element PU, so that the pull-up element PU may remain turned off. Accordingly, although a drain voltage of the pull-up element PU increases, a voltage difference between the gate and the source may be maintained, and the pull-up element PU may not be turned on.

FIGS. 6 to 9 are diagrams schematically illustrating semiconductor devices according to example embodiments.

Referring to FIGS. 6 to 9, each of the semiconductor devices 400, 400A, 400B and 400C according to example embodiments may include a first power pad 401, a second power pad 402, a signal pad 403, a logic circuit 410, a clamping circuit 430, and an input/output protection circuit 440. The semiconductor devices 400, 400A, 400B and 400C may include first gate-off circuits 420, 420A, 420B and 420C connected to the pull-down element PD of the logic circuit 410. In example embodiments illustrated in FIGS. 6 to 9, among the elements included in the logic circuit 410, a target element to be protected in the ESD event condition by interfering with the formation of the current path may be a pull-down element PD.

As described with reference to FIGS. 6 to 9, the first gate-off circuits 420, 420A, 420B and 420C may have different structures. First, referring to FIG. 6, the first gate-off circuit 420 may include a switch element SW, a first transistor TR1, a second transistor TR2, and an input resistor RIN.

Figure 6:
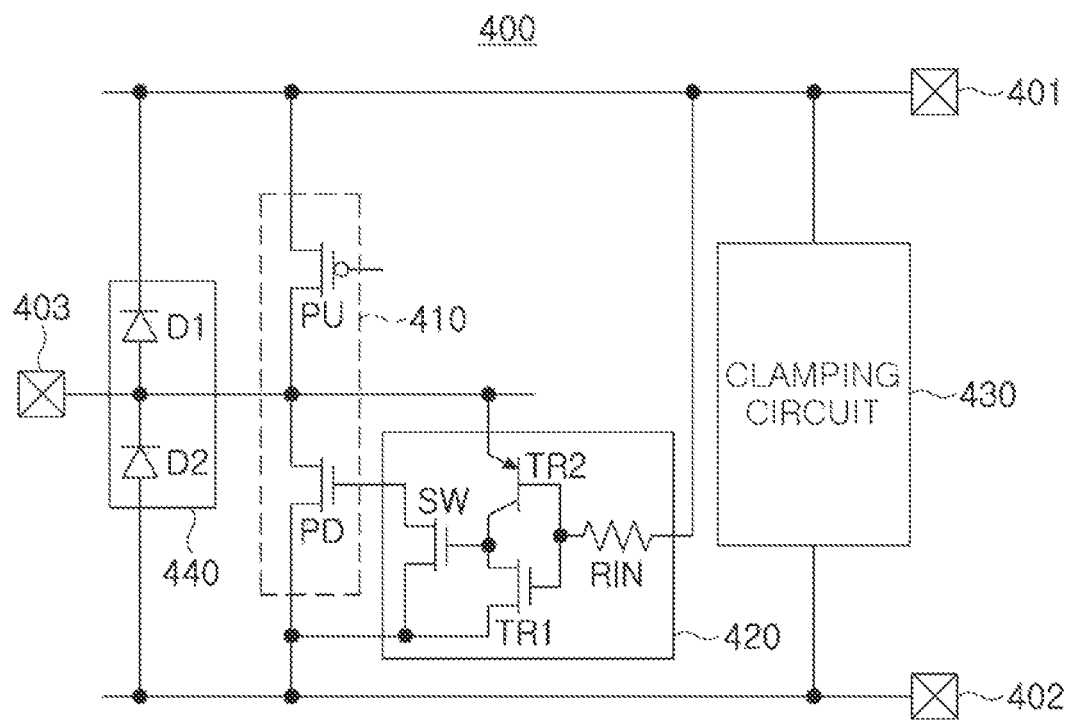
FIGS. 6 to 9 are diagrams schematically illustrating semiconductor devices according to example embodiments.

As illustrated in FIG. 6, each of the switch element SW and the first transistor TR1 may be an NMOS transistor, and the second transistor TR2 may be a PNP transistor. The first transistor TR1 may be connected to a gate and a source of the switch element SW. For example, the first transistor TR1 may operate as a resistance element, a drain may be connected to the gate of the switch element SW, and a source may be connected to the source of the pull-down element PD. An emitter of the second transistor TR2 may be connected to the signal pad 303, and a collector thereof may be connected to the gate of the switch element SW.

The switch element SW may be connected between the gate and the source of the pull-down element PD. Because the gate of the switch element SW is connected to a node between the first transistor TR1 and the second transistor TR2, the switch element SW may be turned on and off according to a voltage of the node between the first transistor TR1 and the second transistor TR2.

In a state in which the first power pad 401, the second power pad 402, and the signal pad 403 are floated, an ESD event in which the high voltage is applied to the signal pad 403 due to the external ESD may occur. When a current generated by the high voltage applied to the signal pad 403 is introduced into the logic circuit 410 under the ESD event condition, as an emitter current of the second transistor TR2 increases, a voltage between a drain and a source of the first transistor TR1 operating as a resistance element may increase. Accordingly, the voltage of the node between the first transistor TR1 and the second transistor TR2 may increase, thereby turning on the switch element SW.

As the switch element SW is turned on, the gate and the source of the pull-down element PD may be connected to each other, and the pull-down element PD may not be turned on (i.e., may be off) despite a current introduced from the signal pad 403. Accordingly, the current introduced from the signal pad 403 may flow to the second power pad 402 through a current path including the first diode D1 and the clamping circuit 430, thereby preventing damage to the pull-down element PD.

The first transistor TR1 may have a relatively high channel resistance so that voltage may be divided between the first transistor TR1 and the second transistor TR2 by the current introduced from the signal pad 403. For example, a length of a gate of the first transistor TR1 may be longer than a length of the gate of the switch element SW, and may be 2 micrometers (um) or more.

The gate of the first transistor TR1 and a base of the second transistor TR2 may be connected to the first power pad 401 through an input resistor RIN. Accordingly, in a general operation condition in which the first power pad 401, the second power pad 402, and the signal pad 403 are not floated and are connected to other external devices, a power voltage may be input to the gate of the first transistor TR1 and the base of the second transistor TR2 through the first power pad 401.

In the general operation condition, a reference voltage on a level lower than that of the power voltage may be input to the second power pad 402. Accordingly, the first transistor TR1 may be turned on and the reference voltage may be input to the gate of the switch element SW, thus turning off the switch element SW. Because the switch element SW is turned off, the first gate-off circuit 420 may not affect turn-on and turn-off operations of the pull-down element PD in the general operating condition. In the general operation condition, an operation of the logic circuit 410 may be determined by a control signal input to the gates of each of the pull-up element PU and the pull-down element PD by a core circuit included in the semiconductor device 400.

Figure 7:
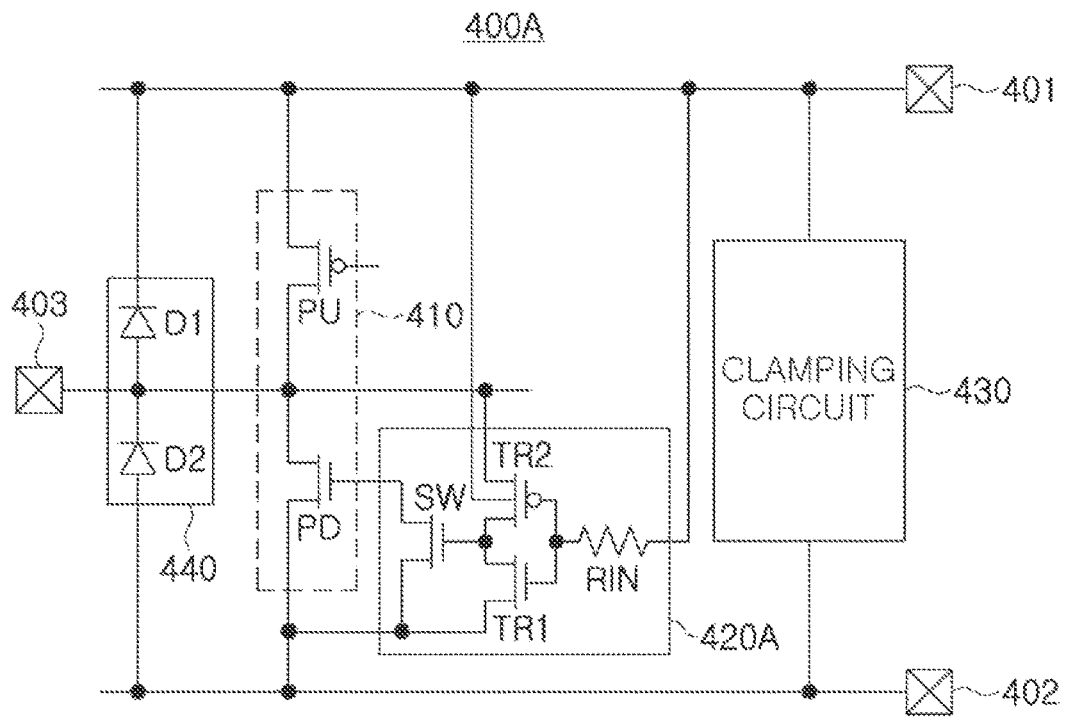

Next, in the semiconductor device 400A according to an example embodiment illustrated in FIG. 7, the first gate-off circuit 420A may include a switch element SW, a first transistor TR1, a second transistor TR2, and an input resistance RIN. Unlike the description with reference to FIG. 6 described above, in an example embodiment illustrated in FIG. 7, the second transistor TR2 may be implemented as a PMOS transistor instead of a PNP transistor. A body terminal of the second transistor TR2 may be connected to the first power pad 401.

When the high voltage is applied to the signal pad 403 due to the external ESD in a state which the first power pad 401 and the second power pad 402 are floated, a current generated by the high voltage applied to the signal pad 403 may flow to the second power pad 402 through the first diode D1 and the clamping circuit 430. However, due to the high voltage applied to the signal pad 403, a gate voltage of the pull-down element PD may increase due to a coupling effect between the drain and the gate of the pull-down element PD, and a channel may be formed in the pull-down element PD, so that a current may flow to the second power pad 402 through the pull-down element PD. In this case, the pull-down element PD may be damaged.

In an example embodiment illustrated in FIG. 7, a source voltage of the second transistor TR2 may increase due to the high voltage applied to the signal pad 403, and accordingly, the second transistor TR2 and the switch element SW may be turned on. As the switch element SW is turned on, the gate and source of the pull-down element PD are connected to each other by the first gate-off circuit 420A, and despite the coupling effect between the drain and the gate of the pull-down element PD, the gate voltage of the pull-down element PD may not increase. Accordingly, the current introduced into the signal pad 403 by the external ESD or the like may be directed away from the logic circuit 410 to the second power pad 402 through the first diode D1 and the clamping circuit 430.

In the general operation condition in which the power voltage is applied to the first power pad 401 and the reference voltage is applied to the second power pad 402, the first transistor TR1 may be turned on by a power voltage input through the input resistor RIN. The second transistor TR2 may be turned off by a power voltage input to the body terminal, and accordingly, the switch element SW may be turned off when the power voltage is supplied. Because the switch element SW, the first gate-off circuit 420A may not affect an operation of the pull-down element PD in the general operation condition.

Figure 8:
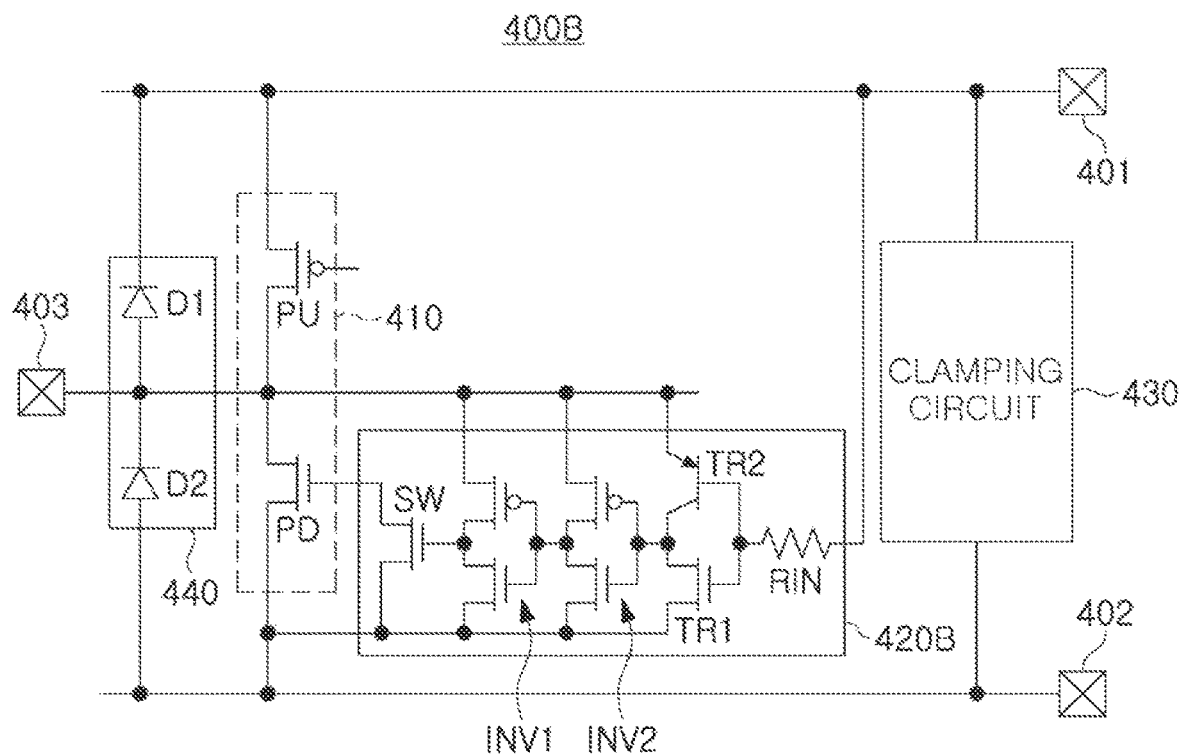

Next, referring to FIG. 8, the first gate-off circuit 420B of the semiconductor device 400B may include a switch element SW, a first transistor TR1, a second transistor TR2, an input resistor RIN, and a plurality of buffers INV1 and INV2. Each of the plurality of buffers INV1 and INV2 may be implemented as an inverter circuit. In an example embodiment illustrated in FIG. 8, the second transistor TR2 may be implemented as a PNP transistor, which is a bipolar junction transistor, as described above with reference to FIG. 6. However, example embodiments are not limited thereto, and for example, the second transistor TR2 may be implemented as a PMOS transistor as illustrated in FIG. 7.

When the ESD or the like occurs in an external space adjacent to the semiconductor device 400B in a state in which the pads 401 to 403 are floated, the high voltage may be applied to at least one of the pads 401 to 403, and a resulting current may be introduced into the semiconductor device 400B. For example, when the current introduced through the signal pad 403 flows in the semiconductor device 400B to an element other than the clamping circuit 430, a corresponding element may be damaged.

For example, a parasitic capacitance present between the drain and the gate of the pull-down element PD may be charged with a current generated by the ESD, and the gate voltage of the pull-down element PD may increase, thus turning on the pull-down element PD and forming a current path through the pull-down element PD. In this case, the current generated by the ESD may not pass through the input/output protection circuit 440 and the clamping circuit 430, damaging the pull-down element PD.

Similarly to the description above with reference to FIG. 6, in an example embodiment illustrated in FIG. 8, a current introduced into the signal pad 403 may act as an emitter current. The drain voltage of the first transistor TR1 functioning as a resistance element may increase due to an emitter current input to the second transistor TR2. The drain voltage of the first transistor TR1 may be input to the switch element SW through the first buffer INV1 and the second buffer INV2, and the switch element SW may be turned on to reduce the gate voltage of the pull-down element PD. Accordingly, the pull-down element PD may remain turned off, thereby preventing the current introduced into the signal pad 403 from flowing into the pull-down element PD.

Figure 9:
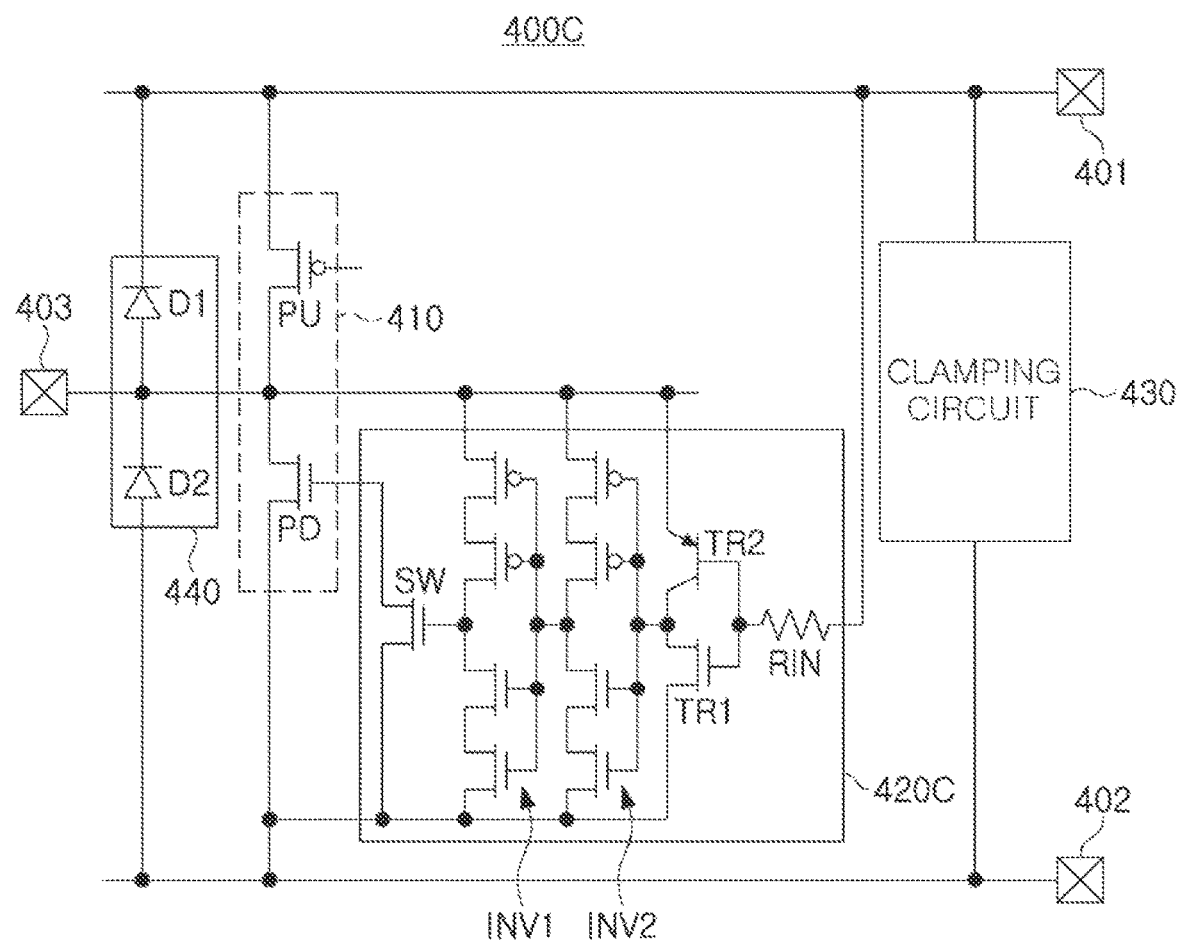

The first gate-off circuit 420C of the semiconductor device 400C according to an example embodiment illustrated in FIG. 9 may include a plurality of buffers INV1 and INV2 in a manner similar to the first gate-off circuit 420B described with reference to FIG. 8. However, example embodiments are not limited thereto, and as illustrated in FIG. 9, each of the plurality of buffers INV1 and INV2 may include a plurality of PMOS transistors and a plurality of NMOS transistors connected in series with each other.

As described above with reference to FIGS. 6 to 9, gate-off circuits 420, 420A, 420B and 420C for preventing inflow of the current generated due to the ESD may be connected only to the pull-down element PD. However, according to example embodiments, the gate-off circuit for preventing the inflow of the current under the ESD event condition in which the ESD is generated may also be connected to the pull-up element PU. Hereinafter, it will be described in more detail with reference to FIGS. 10 to 13.

FIGS. 10 to 13 are diagrams schematically illustrating semiconductor devices according to example embodiments.

Referring to FIGS. 10 to 13, each of the semiconductor devices 500, 500A, 500B and 500C according to example embodiments may include a plurality of pads 501 to 503, a logic circuit 510, a clamping circuit 530, and an input/output protection circuit 540. The semiconductor devices 500, 500A, 500B and 500C may include second gate-off circuits 520, 520A, 520B and 520C connected to a pull-up element PU of the logic circuit 510. As described with reference to FIGS. 10 to 13, among the elements included in the logic circuit 510, a target element to be protected in the ESD event condition by interfering with the formation of a current path may be a pull-up device PU.

According to example embodiments, the second gate-off circuits 520, 520A, 520B and 520C may have different structures. First, in an example embodiment illustrated in FIG. 10, the second gate-off circuit 520 may include a switch element SW, a first transistor TR1, a second transistor TR2, and an input resistor RIN.

Figure 10:
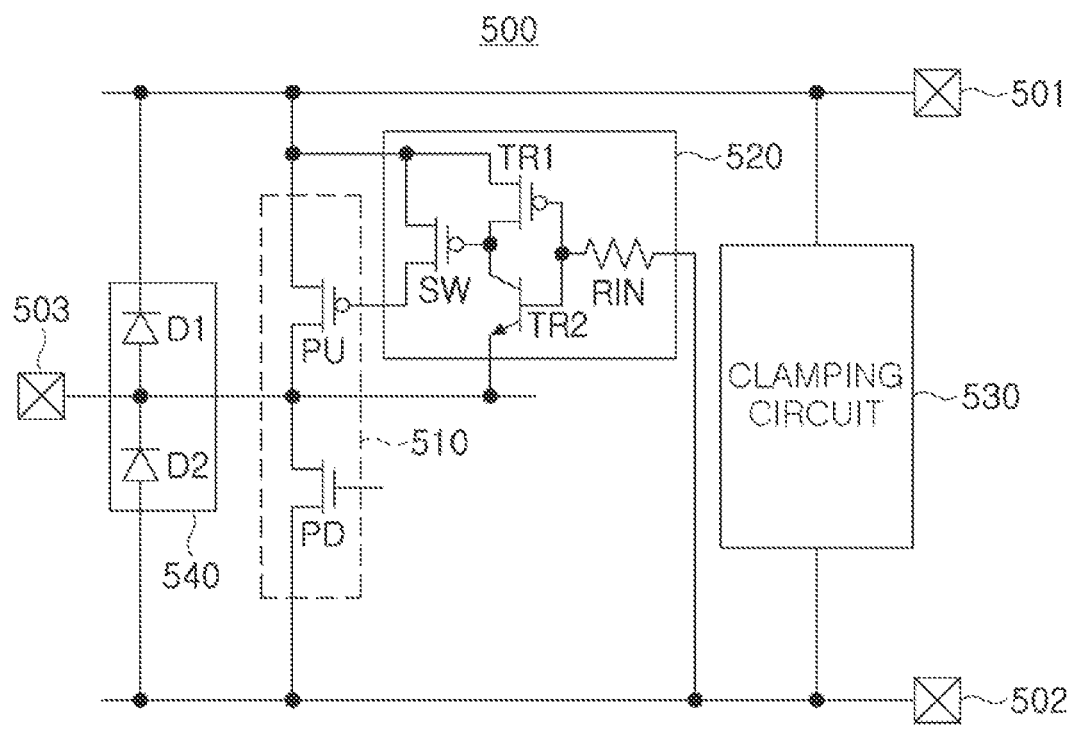
FIGS. 10 to 13 are diagrams schematically illustrating semiconductor devices according to example embodiments.

Referring to FIG. 10, each of the switch element SW and the first transistor TR1 may be a PMOS transistor, and the second transistor TR2 may be an NPN transistor. A source of the first transistor TR1 may be connected to a source of the switch element SW, and a drain of the first transistor TR1 may be connected to a gate of the switch element SW. For example, the first transistor TR1 may operate as a resistance element. An emitter of the second transistor TR2 may be connected to the signal pad 303, and a collector thereof may be connected to the gate of the switch element SW.

The switch element SW may be connected between the gate and the source of the pull-up element PU. The gate of the switch element SW may be connected to the node between the first transistor TR1 and the second transistor TR2, and the switch element SW may be turned on and off according to a voltage of the node between the first transistor TR1 and the second transistor TR2.

When the ESD occurs in an external space adjacent to the semiconductor device 500 in a state in which the plurality of pads 501 to 503 are floated, the high voltage may be applied to the signal pad 503 and a resulting current may be introduced. When the current is introduced into the logic circuit 510 under the ESD event condition, with a decrease in an emitter current of the second transistor TR2, a voltage between the drain and the source of the first transistor TR1 operating as a resistance element may decrease. Accordingly, a voltage of the node between the first transistor TR1 and the second transistor TR2 may decrease, and a gate voltage of the switch element SW may decrease, thereby turning on the switch element SW.

As the switch element SW is turned on, the gate and the source of the pull-up element PU may be connected to each other, and the pull-up element PU may remain turned off despite a current introduced from the signal pad 503. Accordingly, the current introduced from the signal pad 503 may flow through the current path including the first diode D1 and the clamping circuit 530, and the current may be prevented from being introduced into the pull-up element PU to prevent damage to the pull-up element PU.

The first transistor TR1 may have a relatively high channel resistance so that the voltage may be effectively divided between the first transistor TR1 and the second transistor TR2 by the current introduced from the signal pad 503. In an example embodiment, the first transistor TR1 may have a gate length of 2 um or more.

The gate of the first transistor TR1 and the base of the second transistor TR2 may be connected to the second power pad 501 through the input resistor RIN. Accordingly, in the general operation condition in which a power voltage is input to the first power pad 501 and a reference voltage on a level lower than that of the power voltage is input to the second power pad 502, a reference voltage may be input to the gate of the first transistor TR1 and the base of the second transistor TR2.

Accordingly, in the general operation condition, because the power voltage is input to the source of the first transistor TR1 and the reference voltage is input to the gate of the first transistor TR1, the first transistor TR1 may be turned on to provide the power voltage to the gate of the switch element SW. Accordingly, because the switch element SW is turned off, the second gate-off circuit 520 may not affect an operation of the logic circuit 510 under the general operation condition. As described above, the operation of the logic circuit 510 under the general operation condition may be determined by the control signal input to the gates of each of the pull-up element PU and the pull-down element PD by the core circuit included in the semiconductor device 500.

Figure 11:
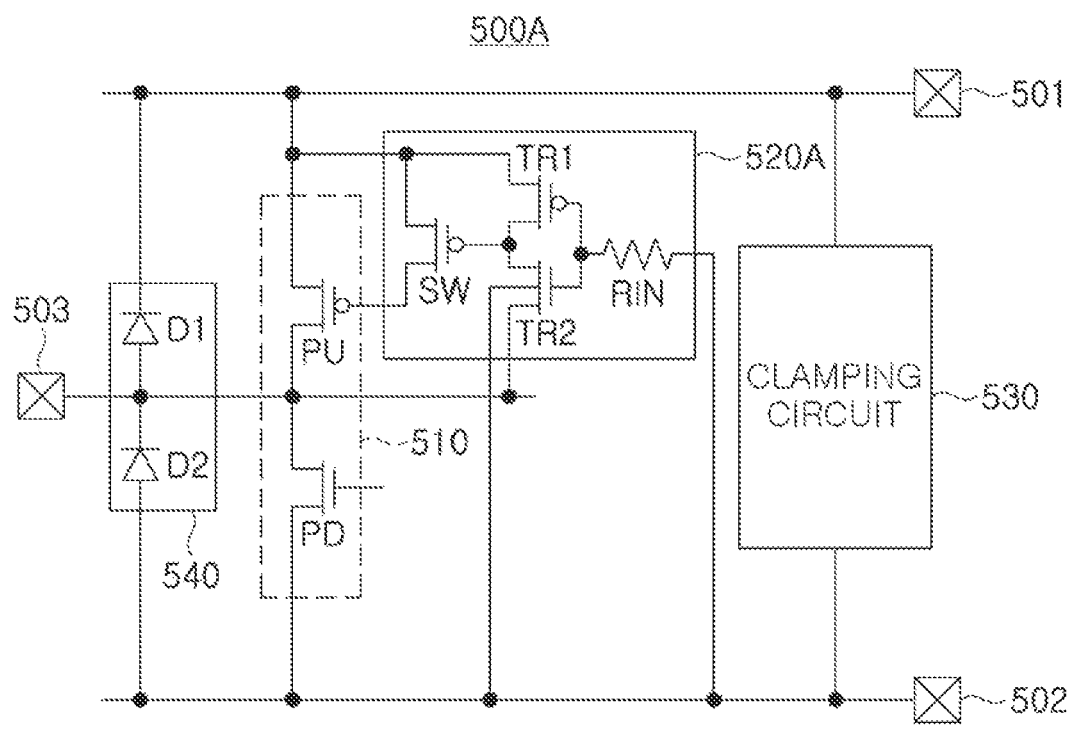

Next, in the semiconductor device 500A according to an example embodiment illustrated in FIG. 11, the second gate-off circuit 520A may include a switch element SW, a first transistor TR1, a second transistor TR2, and an input resistance RIN. In an example embodiment illustrated in FIG. 11, the second transistor TR2 may be implemented as an NMOS transistor instead of an NPN transistor. A body terminal of the second transistor TR2 may be connected to the second power pad 502.

When the high voltage is applied to the signal pad 503 due to the external ESD in a state in which the plurality of pads 501 to 503 are floated, a current flowing from the signal pad 503 into the semiconductor device 500A may be generated. In an ideal case, a current introduced into the signal pad 503 may flow to the second power pad 402 through the first diode D1 and the clamping circuit 530. However, due to a high voltage applied to the signal pad 503 and a current generated therefrom, the gate voltage of the pull-up element PU may decrease, and accordingly, a channel may be formed in the pull-up element PU, thus enabling the current to be introduced into the pull-up element PU. In an example embodiment, by forming the channel in the pull-up element PU, the current generated by the ESD may flow to the clamping circuit 530 through the pull-up element PU instead of the first diode D1.

In an example embodiment illustrated in FIG. 11, a source voltage of the second transistor TR2 increases by the high voltage applied to the signal pad 403, and accordingly, the second transistor TR2 and the switch element SW may be turned on. As the switch element SW is turned on, the gate and source of the pull-up element PU may be connected to each other, and despite the coupling effect between the drain and the gate of the pull-up element PU, a voltage difference between the source and the gate of the pull-up element PU may not increase due to the second gate-off circuit 520A. Accordingly, the current generated by the ESD or the like and introduced into the semiconductor device 500A may be directed away from the logic circuit 510 to the second power pad 402 through the first diode D1 and the clamping circuit 530.

Figure 12:
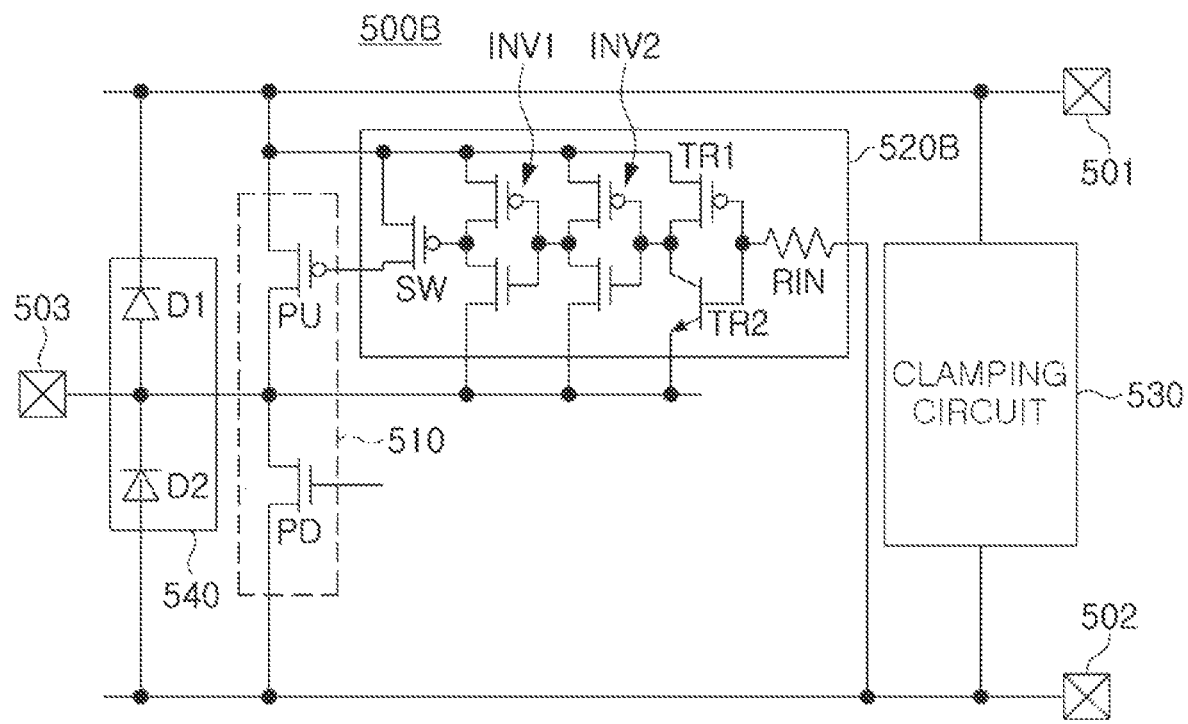

Next, referring to FIG. 12, the second gate-off circuit 520B of the semiconductor device 500B may include a switch element SW, a first transistor TR1, a second transistor TR2, an input resistor RIN, and a plurality of buffers INV1 and INV2. Each of the plurality of buffers INV1 and INV2 may be implemented as an inverter circuit. In an example embodiment illustrated in FIG. 12, the second transistor TR2 may be implemented as an NPN transistor that is a bipolar junction transistor. However, example embodiments are not limited thereto, and for example, the second transistor TR2 may be implemented as an NMOS transistor.

When the ESD occurs in an external space adjacent to the semiconductor device 500B in a state in which the pads 501 to 503 are floated, a high voltage may be applied to at least one of the pads 501 to 503, and a resulting current may be introduced into the semiconductor device 500B. For example, when a current is introduced through the signal pad 503 and the current flows from an interior of the semiconductor device 500B to an element other than the clamping circuit 530, a corresponding device may be damaged.

In an example embodiment illustrated in FIG. 12, a current introduced into the signal pad 503 may act as an emitter current of the second transistor TR2. A drain voltage of the first transistor TR1 functioning as a resistance element may decrease due to the emitter current input to the second transistor TR2. A drain voltage of the first transistor TR1 may be input to the switch element SW through the first buffer INV1 and the second buffer INV2, and the switch element SW may be turned on to connect the gate and the source of the pull-up element PU to each other. Accordingly, by minimizing a change in a source voltage of the pull-up element PU, the pull-up element PU may be prevented from being turned on, and the current generated by the ESD may be prevented from flowing to the pull-up element PU.

Figure 13:
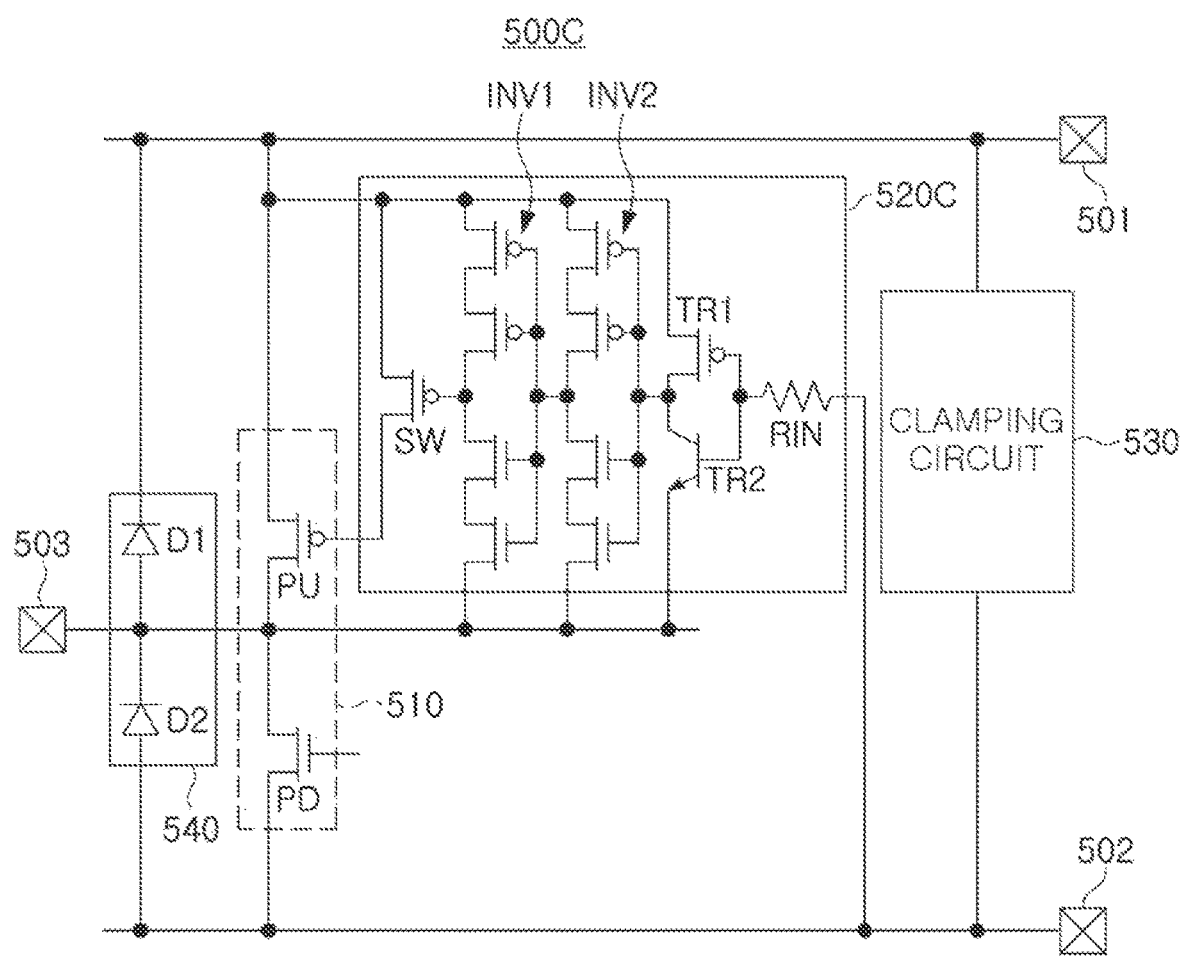

The second gate-off circuit 520C of the semiconductor device 500C according to an example embodiment illustrated in FIG. 13 may include a plurality of buffers INV1 and INV2 in a manner similar to the second gate-off circuit 520B described with reference to FIG. 12. However, in an example embodiment illustrated in FIG. 13, each of the plurality of buffers INV1 and INV2 may include the plurality of PMOS transistors and the plurality of NMOS transistors connected in series with each other.

According to an example embodiment, the semiconductor device may include both the first gate-off circuit connected to the pull-down element PD and the second gate-off circuit connected to the pull-up element PU. Hereinafter, it will be described in more detail with reference to FIG. 14.

Figure 14:
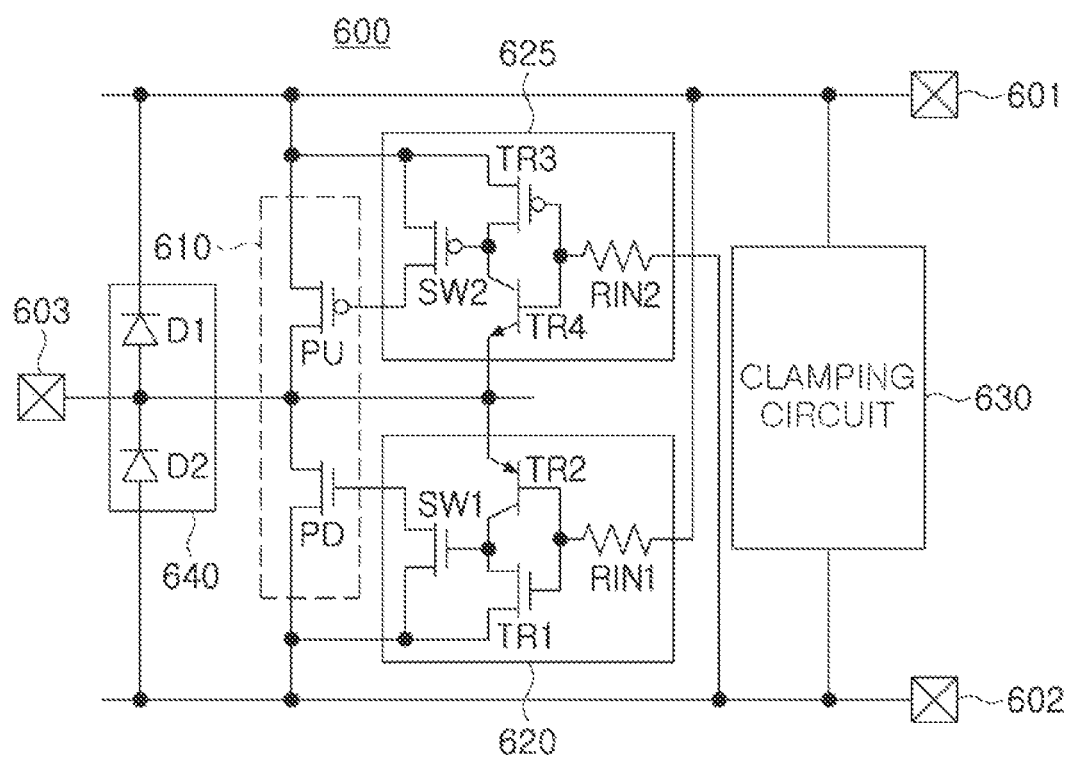
FIG. 14 is a diagram schematically illustrating a semiconductor device according to an example embodiment.

FIG. 14 is a diagram schematically illustrating a semiconductor device according to an example embodiment.

Referring to FIG. 14, a semiconductor device 600 according to an example embodiment may include a plurality of pads 601 to 603, a logic circuit 610, a first gate-off circuit 620, a second gate-off circuit 625, a clamping circuit 630, and an input/output protection circuit 640. The logic circuit 610 may be a driving circuit for outputting a signal through the signal pad 603, and may include a pull-up element PU and a pull-down element PD. However, example embodiments are not limited thereto, and for example, the logic circuit 610 may include a circuit having another function.

The first gate-off circuit 620 connected to the pull-down element PD may include a first switch element SW1, a first transistor TR1, a second transistor TR2, and a first input resistor RIN1. The second gate-off circuit 625 connected to the pull-up element PU may include a second switch element SW2, a third transistor TR3, a fourth transistor TR4, and a second input resistor RIN2. Referring to FIG. 14, the first gate-off circuit 620 may be substantially similar to the first gate-off circuit 420 described with reference to FIG. 6, and the second gate-off circuit 625 may be substantially similar to the second gate-off circuit 520 example described with reference to FIG. 10. However, according to example embodiments, structures of each of the first gate-off circuit 620 and the second gate-off circuit 625 may be variously modified.

Each of the pull-down element PD, the first transistor TR1 and the first switch element SW1 may be an NMOS transistor. Each of the pull-up element PU, the third transistor TR3 and the second switch element SW2 may be a PMOS transistor. Each of the second transistor TR2 and the fourth transistor TR4 may be a bipolar junction transistor, the second transistor TR2 may be a PNP transistor, and the fourth transistor TR4 may be an NPN transistor.

The first input resistor RIN1 may be connected to a first power pad 601, and the second input resistor RIN2 may be connected to a second power pad 602. In a normal operating condition in which the plurality of pads 601 to 603 are connected to other external devices, a power voltage is supplied to the first power pad 601 and a reference voltage is supplied to the second power pad 602, the first transistor TR1 and the third transistor TR3 may be turned on, respectively, and the first switch element SW1 and the second switch element SW2 may be turned off. Accordingly, each of the first gate-off circuit 620 and the second gate-off circuit 625 may not affect the logic circuit 610 under the general operation condition.

When the plurality of pads 601 to 603 are floated and current is introduced into the semiconductor device 600 due to the ESD or the like, the current may flow through the clamping circuit 630 and the input/output protection circuit 640. In an example embodiment, in order to prevent the current introduced into the signal pad 603 from flowing into the logic circuit 610, the first gate-off circuit 620 may connects the gate and the source of the pull-down element PD to each other, and the second gate-off circuit 625 may connect the gate and the source of the pull-up element PU to each other.

While aspects of example embodiments have been particularly shown and described, it will be understood that various changes in form and details may be made therein without departing from the spirit and scope of the following claims.

What is claimed is:

1. A semiconductor device comprising:
  a first power pad;
  a second power pad;
  a signal pad;
  a clamping circuit connected between the first power pad and the second power pad;
  a driving circuit connected to the signal pad and comprising a pull-up circuit and a pull-down circuit; and
  a first gate-off circuit connected to the pull-down circuit and comprising a voltage dividing circuit,
  wherein the first gate-off circuit is configured to connect a gate of a pull-down element included in the pull-down circuit and a source of the pull-down circuit to each other during an electrostatic discharge (ESD) event in which a high voltage is applied to the signal pad, and control a current generated by the high voltage to flow to the clamping circuit, and
  wherein the voltage dividing circuit comprises a first transistor and a second transistor connected in series between the signal pad and the second power pad, and a voltage of the first power pad is provided to a control terminal of the first transistor and a control terminal of the second transistor.

2. The semiconductor device of claim 1, wherein the first power pad, and the second power pad are floated during the ESD event.

3. The semiconductor device of claim 1, wherein the first gate-off circuit receives a power voltage while the power voltage is input to the first power pad and a reference voltage having a level lower than a level of the power voltage is input to the second power pad.

4. The semiconductor device of claim 1, wherein the first gate-off circuit comprises a switch circuit connected between the gate of the pull-down element and the source of the pull-down element, and
  wherein the voltage dividing circuit is configured to obtain a divided voltage by dividing the high voltage and provide the divided voltage to a gate of the switch circuit.

5. The semiconductor device of claim 4, wherein the pull-down circuit comprises a first n-channel metal oxide semiconductor (NMOS) transistor, the switch circuit comprises a second NMOS transistor, and the second transistor of the voltage dividing circuit is a PNP transistor.

6. The semiconductor device of claim 5, wherein an emitter of the PNP transistor is connected to the signal pad, and a collector of the PNP transistor is connected to the gate of the switch circuit.

7. The semiconductor device of claim 6, wherein the voltage dividing circuit further comprises a third NMOS transistor connected in series with the PNP transistor, and
  wherein a drain of the third NMOS transistor is connected to the gate of the second NMOS transistor, and a source of the third NMOS transistor is connected to the source of the first NMOS transistor.

8. The semiconductor device of claim 7, wherein a length of a gate of the third NMOS transistor is greater than a length of the gate of the first NMOS transistor.

9. The semiconductor device of claim 7, wherein a gate of the third NMOS transistor and a base of the PNP transistor are connected to the first power pad.

10. The semiconductor device of claim 4, wherein the pull-down circuit comprises a first n-channel metal oxide semiconductor (NMOS) transistor, and the switch circuit comprises a second NMOS transistor, and
  wherein the second transistor of the voltage dividing circuit is a p-channel metal oxide semiconductor (PMOS) transistor.

11. The semiconductor device of claim 10, wherein a body terminal of the PMOS transistor is connected to the first power pad.

12. The semiconductor device of claim 4, wherein the first gate-off circuit further comprises a buffer circuit connected between the switch circuit and the voltage dividing circuit.

13. The semiconductor device of claim 1, further comprising a second gate-off circuit connected to the pull-up circuit.

14. A semiconductor device comprising:
- a first power pad configured to receive a first power voltage;
- a second power pad configured to receive a second power voltage having a level lower than a level of the first power voltage;
- a driving circuit connected to a signal pad, and comprising a pull-up element and a pull-down element; and
- a gate-off circuit comprising a switch circuit connected between a source and a gate of at least one of the pull-down element and the pull-up element, a first transistor connected between one of the first power pad and the second power pad and a gate of a switch element of the switch circuit, and a second transistor connected between the gate of the switch element and the signal pad,
- wherein the first power voltage or the second power voltage is provided to a control terminal of the first transistor and a control terminal of the second transistor.

15. The semiconductor device of claim 14, wherein the switch circuit and the second transistor are implemented by a common type of transistor, and the first transistor and the second transistor are different types of transistors.

16. The semiconductor device of claim 14, wherein the first transistor is connected to the first power pad, and
wherein the control terminal of the first transistor and the control terminal of the second transistor are connected to the second power pad.

17. The semiconductor device of claim 16, wherein the second transistor is an NPN transistor.

18. The semiconductor device of claim 14, wherein the first transistor is connected to the second power pad, and
wherein the control terminal of the first transistor and the control terminal of the second transistor are connected to the first power pad.

19. The semiconductor device of claim 18, wherein the first transistor is a PNP transistor.

20. A semiconductor device comprising:
- an electrostatic discharge (ESD) protection circuit connected to a pad and configured to provide a path through which an ESD current flows;
- a logic circuit connected to the pad; and
- a gate-off circuit connected to a target element included in the logic circuit, and comprising a switch circuit configured to be turned on by the ESD current flowing from the pad in a state in which the pad is floated and configured to connect a gate of the target element and a source of the target element to each other, and a voltage dividing circuit configured to turn on the switch circuit based on the ESD current flowing from the pad,
- wherein the voltage dividing circuit comprises a first transistor and a second transistor connected in series, and a voltage is commonly provided to a control terminal of the first transistor and a control terminal of the second transistor.

* * * * *